(12) United States Patent
Laouamri et al.

(10) Patent No.: US 7,725,784 B2
(45) Date of Patent: May 25, 2010

(54) INTEGRATED CIRCUIT CHIP WITH COMMUNICATION MEANS ENABLING REMOTE CONTROL OF TESTING MEANS OF IP CORES OF THE INTEGRATED CIRCUIT

(75) Inventors: Oussama Laouamri, Moirans (FR); Chouki Aktouf, Romans sur Isere (FR)

(73) Assignee: Institut National Polytechnique de Grenoble, Grenoble (FR)

( * ) Notice: Subject to any disclaimer, the term of this patent is extended or adjusted under 35 U.S.C. 154(b) by 551 days.

(21) Appl. No.: 10/589,489

(22) PCT Filed: Feb. 17, 2005

(86) PCT No.: PCT/EP2005/001629

§ 371 (c)(1),
(2), (4) Date: Jun. 25, 2007

(87) PCT Pub. No.: WO2005/078465

PCT Pub. Date: Aug. 25, 2005

(65) Prior Publication Data

US 2008/0034334 A1 Feb. 7, 2008

Related U.S. Application Data

(60) Provisional application No. 60/544,319, filed on Feb. 17, 2004.

(51) Int. Cl.
*G01R 31/28* (2006.01)
(52) U.S. Cl. .......................... 714/724; 716/4

(58) Field of Classification Search ................ 370/350; 716/12, 4; 324/158.1; 714/726, 727, 729, 714/724
See application file for complete search history.

(56) References Cited

U.S. PATENT DOCUMENTS

| | | | |
|---|---|---|---|
| 6,877,122 B2 * | 4/2005 | Whetsel ...................... 714/727 |
| 7,046,657 B2 * | 5/2006 | Harrington et al. .......... 370/350 |
| 7,058,918 B2 * | 6/2006 | Abramovici et al. .......... 716/12 |
| 7,437,635 B1 * | 10/2008 | Dang et al. .................. 714/726 |
| 7,441,170 B2 * | 10/2008 | Whetsel ...................... 714/727 |

(Continued)

OTHER PUBLICATIONS

O. Laouamri et al., "Enhancing Testability of System on Chips Using Network Management Protocols", Proceedings of the Design, Automation and Test in Europe Conference and Exhibition (2004).

(Continued)

*Primary Examiner*—David Ton
(74) *Attorney, Agent, or Firm*—Clark & Brody

(57) ABSTRACT

The present invention relates to the testing of functional or IP cores forming part of a system on chip, SoC. The invention is implemented using a testing means and a communication means to test at least one functional or IP core. The testing means comprises a wrapper in which the core is embedded, this wrapper implements preferably the IEEE P1500 standard architecture but can also implement other standard architectures. The testing means can be extended to a Simple Network Management Protocol, SNMP, the widely adopted TCP/IP management protocol. The communication means comprises a test bus connected to the communication network. The proxy agent can implement the SNMP protocol, among others.

12 Claims, 9 Drawing Sheets

Figure 1:
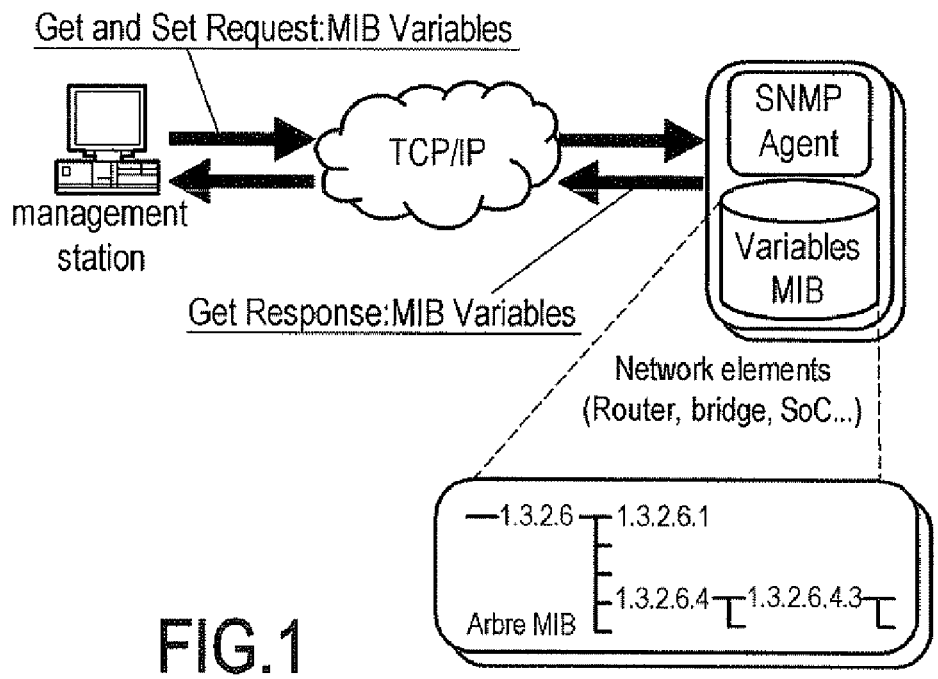

U.S. PATENT DOCUMENTS 7,525,305 B2 * 4/2009 Whetsel ............... 324/158.1
2003/0120986 A1 6/2003 Whetsel

OTHER PUBLICATIONS

O. Laouamri et al., "Hardware-based Network Management Framework for Monitoring and Testing of System-On-Chips", 8th International Conference on Telecommunications, Jun. 15-17, 2005.

O. Laouamri et al., "Remote Testing and Diagnosis of System-on-Chips Using Network Management Frameworks", © 2007, EDAA.

O. Laouamri et al., "Towards a Complete SNMP-Based Supervision of System-on-Chips", Journal of Network and Systems Management, vol. 13, No. 4, Dec. 2005, pp. 373-386.

* cited by examiner

DFA Deterministic Finite Automation
OID Object Identifier

INTEGRATED CIRCUIT CHIP WITH COMMUNICATION MEANS ENABLING REMOTE CONTROL OF TESTING MEANS OF IP CORES OF THE INTEGRATED CIRCUIT

The invention is related to the implementation of network management protocols for the purpose of a deep testing and management of network-based electronic systems such as routers, switches and personal computers. The invention is more particularly related to the implementation of network management functions (monitoring, control, test . . . ) at the level of a single integrated circuit chip for the purpose of testing the functional or IP cores of the integrated circuit. The invention finds a preferred implementation within a system on a single chip (SoC).

Design-For-Test (DFT) techniques consist in integrating testability features at the design stage of electronic components. DFT techniques become mandatory today for manufacture testing of integrated circuits and systems. Among the widely used DFT techniques there is the IEEE standard called P1500 [1-5]. The [No] notation refers to a list of publications at the end of the description of the present application. P1500 improves the testability (controllability and observability) of System-on-Chips (SoCs) by adding more logic and inputs/outputs. A SoC, which composes a networking device, embeds hundreds of million of transistors. Such a huge amount of transistors within a single chip makes possible the implementation of complex functionalities such as signal processing, networking, telecommunications, calculation and memorizing. Designing a SoC is mainly based on the use and the reuse of Intellectual Proprieties (IP) such as processor RISC, DSP, RAM and ROM [2]. Testing such chips is one of the main challenges for the semi-conductor industries. Given the increasing density of integration for today integrated circuits, it becomes harder to have access, for test purposes, to IP cores inputs/outputs since such cores are deeply embedded within the SoC [4]. DFT techniques have been considered to facilitate the maintainability and the management of electronic systems (e.g. routers, switches) that belong to a managed TCP/IP network but at this point none of the known techniques propose to take advantage of the existing communication network in order to enhance the testing functionalities of SOCs.

In order to achieve this, in present invention a single integrated circuit chip comprises:
  at least one functional or IP core;
  testing means for testing the functional or IP core;
  communication means for connecting the testing means to an external communication network.

According to one aspect of the invention the single integrated circuit chip comprises:
  two or more functional or IP cores
  for each functional or IP core, testing means for testing said functional or IP core,
  communication means for connecting the testing means of each functional or IP core to the external communication network and for enabling at least an individual access to each testing means of each functional or IP core from the external communication network.

In another aspect of the invention, the testing means of each functional or IP core comprise a wrapper in which the functional or IP core is embedded, the wrapper of the testing means of each functional or IP core implements preferably the IEEE P1500 standard architecture but can also be of an other type. In one of its preferred but not exclusive embodiment the invention, the testing means take benefit from the P1500 DFT technique by extending the necessary logic and make is usable by SNMP (Simple Network Management Protocol), the widely adopted TCP/IP management protocol. Furthermore the Classical DFT technique such as P1500 extended and made compliant with SNMP facilitates the access to internal structure of IP cores. This is accomplished through high-level SNMP Management. That is to say, starting from SNMP requests, the hybrid P1500/SNMP DFT architecture proposed by the invention performs IEEE P1500 wrapper boundary scan operations which allows a support for testing and monitoring.

According to one aspect of the invention, the communication means of the integrated circuit chip comprise a test bus connected to the testing means and a proxy agent connected to the test bus and to the communication network. In a preferred but no exclusive embodiment the proxy agent implements the SMNP protocol.

According to another aspect of the invention, the communication means of the integrated circuit ship comprise at least one TCP/IP network interface circuit.

Given a complex SoC, the invention enhances the accessibility and testability to IP cores embedded in the SoC environment. It takes advantage of SNMP which was originally proposed to enhance the management of TCP/IP local area networks. SNMP is considered within a SoC for a better testability of all IP cores and consequently of all SoCs which constitute complex electronics system. To this end and according to one aspect of the invention, P1500 is extended and made compliant with SNMP to facilitate the access to the internal structure of an IP core. According to the invention, SNMP is considered beyond the classical framework of network management because it is implemented within a SoC.

A network management system (SNMP) contains [7-9] [11] at least two primary elements: a manager and agents. The Manager (Network Management System: NMS) is the console through which the network administrator performs network management functions. Agents are the entities that interface to the actual device being managed that contain managed objects. These managed objects might be hardware, configuration parameters, performance statistics, and so on, that directly relate to the current operation of the device in question. These objects are arranged in what is known as a virtual information database called Management Information Base or MIB. SNMP allows managers and agents to communicate for the purpose of accessing these objects through an hierarchical identifier called Object IDentifier (OID).

Main motivations and benefits of using SNMP as a backbone of a testing strategy are summarized as follows: (i) management and monitoring of the activity of various electronic equipments, (ii) collection of deep state information of each component, (iii) detection of network failures, list which shall not be considered as exhaustive and limitative.

Furthermore, P1500 is considered for the following reasons [4]: (i) help in the isolation of an IP core among those which compose the SoC, (ii) provide a standard mechanism of access to internal logic (iii) facilitate the mix and the interconnection of IP cores which are provided from multiple vendors.

To make possible a combination between DFT and network management, a hybrid P1500/SNMP architecture is proposed according to another aspect of the invention and the proxy agent of the communication means comprises an SNMP processor which translates the information between SMNP and P1500 protocols The proposed testing/management approach will also have an important impact on testing economics for the following reasons.

Decrease manufacturing testing costs: typically, when the first SoC comes off the manufacturing line, extensive testing is performed by taking benefit from on-chip DFT logic. But the multimillion dollar test systems that are often required to perform the analysis are usually kept very busy on the production test floor. Indeed, the test time surely being one component of test costs, another part of these costs is the kind of Automatic Test Equipment (ATE) involved in testing. ATE which are used for SoC manufacturing testing are very complex and very costly [10]. Carrying out test patterns on a remote SoC via an existing TCP/IP network makes possible the use of cost-effective ATEs.

Therefore in the present invention, a system for testing at least one functional or IP core embedded in an integrated circuit ship comprises:

an integrated circuit chip according to the invention, a communication network connected to the communication means of the integrated circuit chip, a network management station connected to the communication network and able to communicate with the testing means of the integrated circuit chip via the communication network and the communication means of the integrated circuit chip.

According to one aspect of the invention, it will be the ATE which acts as the network management station which performs an automatic test of a functional or IP core of the integrated circuit chip.

According to another aspect of the invention, the communication means of the integrated circuit chip allow a remote control of the testing means via the communication network. This aspect of the invention, advantageously allows remote using of test classical techniques. In recent SoC based systems the amount of test data transferred between ATEs and devices under test is becoming too large. Even expensive state-of-the-art ATEs restrict the SoC test, as a result of limited memory resources, narrow channel bandwidth and low speed. One known approach to overcome ATE limitations is to use built-in self-test (BIST [12]) to generate patterns and to analyze the results at speed. If the IP core under test has the BIST, The proposed testing/management approach allows to launch the self-test remotely through SNMP set-request and as soon as the self-test finished, the ATE receives in autonomy an unsolicited message, called traps in order that the ATE generates SNMP get-request to retrieve the BIST signature.

Another advantage of the invention is the improve fault diagnosis: collecting internal states of IP cores using basic SNMP requests (e.g. set-request and get-request), it helps to improve fault diagnosis within a SoC. Indeed, the diagnosis software associated to tester operating system of such an approach interacts with the embedded cores through SNMP requests. This software performs embedded test execution and diagnosis requests and recovers execution status results or detailed diagnostic information.

The invention allows also a better maintainability: the management and monitoring of the IP cores activity is possible by taking advantage of important asset in management network domain. Hence, the overall system maintainability is improved. Because within larger digital systems you often find a large number of hardware registers. Generally, these kinds of registers control and monitor hardware functions within the system. It is common practice to separate registers from the functional blocks (FB) of each IP cores, and interconnect them with extended P1500 logic proposed in this approach. Those registers remain attached to the FB. With this facility, we can manage and monitor each IP core of SoC through its extended P1500 logic.

Today, several research works have addressed hardware-based solutions using network protocols and applications. In the Applied Research Lab (ARL) at Washington University in St. Louis, a set of hardware components for research in the field of networking, switching, routing and active networking have been developed. However, hardware components of layered protocol wrappers [13] have been proposed which process Internet packets in reconfigurable hardware. Hence, several network applications have been developed which use this wrapper library [13]. For instance, an Internet router or firewalls are important applications that use the wrapper library to route and filter packets [14, 15]. A single chip has been used to filter Internet SPAM and to guard against several types of network intrusion.

The above research works have not addressed a SNMP hardware-based solution at the application layer. This is important since such a feature has to be considered at the chip level. SNMP is considered as an application layer protocol which uses indeed a TCP/IP suite (in practice UDP is used). The invention implement in a preferred but exclusive embodiment an SNMP agent developed on a wrapper library which has been developed in the paper [13]. The SNMP agent is developed within a SoC to help in the external testing of the overall SoC.

Moreover, there are more SNMP versions published in Request For Comments (RFCs) documents. The first version (SNMPv1) [9] is characterized by the simplicity of management functions. SNMPv2 (RFC's 1901 through 1908) [18] is an enhancement of SNMPv1. The SNMPv3 Framework (RFC's 3411 though 3418) [19] is derived from and builds upon both the SNMPv1 Framework and the SNMPv2 Framework. All versions (SNMPv1, SNMPv2, and SNMPv3) of the Internet-Standard Management Framework share the same basic structure and components. Coexistence issues relating to all versions can be found in RFC 3584 [28]. SNMPv3 is an extensible SNMPv2 framework with a new message format, security abilities, and remote configuration of SNMP parameters.

In addition, many DFT strategies have roots in boundary-scan technology. That technology codified in the IEEE 1149.1 [20] standard, probes chip inputs and outputs and tests the Printed Circuit Board (PCB) interconnect integrity. DFT technology for SoCs aims deeper into chip circuitry and is currently the focus of the IEEE P1500 [1-5] Working Group on Standards for Embedded Core Test. IEEE P1500 standardizes two important aspects of core-based SoC testing: (1) the core test knowledge transfer from core provider to core user by means of standardizing a Core Test Language, and (2) test access to embedded cores by means of standardizing a core wrapper that supports both core-internal and core external testing.

A network management system (SNMP) contains [7-9] (FIG. 1): several nodes, each embeds a processing entity, called an agent. The Agent has access to management instrumentation; at least one management station; and, a management protocol, used to convey management information between the agents and management stations. Operations of the protocol are carried out under an administrative framework which defines both authentication and authorization policies. Network management stations execute management applications which monitor and control network elements. Network elements are monitored and controlled through an access to their management information.

Definitions for related management information, events, and associated implementation compliance requirements are specified in documents called Management Information Base specifications or MIB specifications "Management information is viewed as a collection of managed objects, residing in a virtual information store (MIB) [7]." Collections of related objects are defined in MIB modules. These modules are written using a subset of OSI's (Open System Interconnexion) Abstract Syntax Notation One (ASN. 1) [22]. Indeed, MIBs are specifications containing definitions of management information so that networked systems can be remotely monitored, configured, and controlled [7, 9]. The Structure of Management Information (SMI) [23], to define that subset. The SMI is divided into three parts: module definitions, object definitions, and, trap definitions. Each object instance of any object type defined in the MIB is identified in SNMP operations with an hierarchical identifier called Object IDentifier (OID) [23] of the form x.y, where x is the name of a non-aggregate object type defined in the MIB and y is an OBJECT IDENTIFIER fragment that, in a way specific to the named object type, identifies the desired instance. Using UDP protocol, the manager exchange a set of SNMP Messages with agents (SNMPv1 [9]) or others mangers (SNMPv2 [24]). Indeed, for a manager to monitor and configure its agents, some operations have to be carried out. The get-request, get-next-request and get-bulk-request (SNMPv2) are used for monitoring and set-request message for configuration of the agents. The manager starts by sending a given get-request message and the agent responds to that given message by sending a get-response message back to the manager. To increase the efficiency of the management system, an agent is able to generate unsolicited messages, called traps. This is done when the agent observes the occurrence of a preset parameter in its network element.

Without loss of generality, SNMPv1 is considered in the proposed solution. Indeed, SNMPv1 fully satisfies all the requirement of a testing management solution. The management (FIG. 2) through SNMP is accomplished by retrieving and applying test information. Such information is related to the electronic components (SoC). For example using the SNMP requests (FIG. 2), observe, monitor and test the SoC and all its embedded cores starting from a manager (NMS or ATE in our case). Thus, test response, cartography information or other test information are retrieved by using a standard SNMP-based management software.

Testing a SoC is one of the main challenges for the semiconductor industries. Given the increasing density of integration for today integrated circuits, it becomes harder to have access, for test purposes, to IP cores inputs/outputs since such cores are deeply embedded within the SoC.

In general, the problem of SoC testing requires new challenges [4]:

Efficient transfer of an IP core testing information from the designer to the user, Enhance the access to the internal IP core infrastructure, so as to be able to reach the IP core inputs/outputs and to connect them to an ATE or to a SoC self-test logic.

Optimize test integration to ensure optimal performance overall the necessary cost.

Elaboration of a standard management from the system level to the IP core level as regards to remote access to information base (MIB), Take benefit from available network management software tools such as HPOPEN-VIEW© of Hewlett-Packard®, Functional paradigm for monitoring and control is sufficiently extensible to accommodate additional, possibly unanticipated aspects of network operation and management, Knowing that the number of message (e.g. get-request, get-next-request, etc.) required by SNMP is small, few resources are expected at the level of the chip and the system as well.

Furthermore, P 1500 is considered for the following reasons [4]:

Help in the isolation of an IP core among those which compose the SoC,

Provide a standard mechanism of access to internal logic,

Facilitate the mix and the interconnection of IP cores which are provided from multiple vendors.

Figure 2:
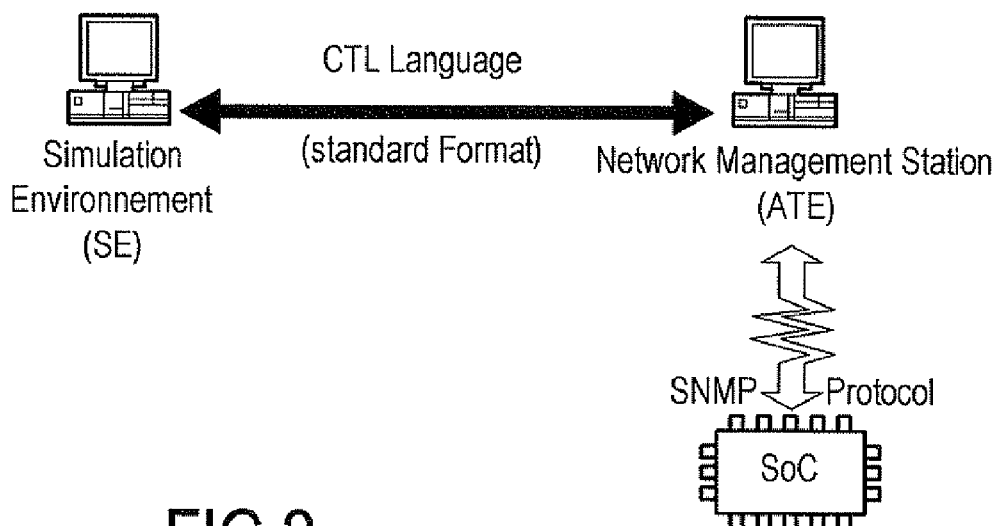

To make possible a combination between DFT and network management, a hybrid P1500/SNMP architecture is proposed. The invention proposes the solution at the levels of both IP core and SoC. The proposed testing management approach will allow as set forth before a reduction of manufacturing testing costs: current Automatic Test Equipments (ATE) which are used for SoC manufacturing testing are very complex and very costly [10]. Carrying out test patterns on a remote SoC via a existing TCP/IP network makes possible the use of cost-effective ATEs. Consequently, data can be carried out from an ATE to a remote electronic device through a classical TCP/IP networking technology (FIG. 2).

The invention will also improve fault diagnosis by collecting internal states of IP cores using basic SNMP requests (e.g. set-request and get-request), it helps to improve fault diagnosis within a SoC.

An IP core is tested by the core integrator as a part of a SoC. This is accomplished by using test vectors that are given by the IP core provider. Indeed, usually the integrator of a SoC has few in-formation on the used IP core. IP cores are considered as black boxes. Today, more than ever an IP core has to be designed with testability issues in mind [4]: test point insertion, Scan, BIST insertion, etc. Beyond testing, another problem comes from the diversity of the origin and the technology of IP cores (mixed-technology designs). IP cores are heterogeneous from several standpoints: the used communication protocols, the used bus interface, frequency, etc. Such heterogeneous parameters imply connection and communication problems between the IP cores. Thus, flexibility and compatibility are more than required by IP core users.

Figure 3:
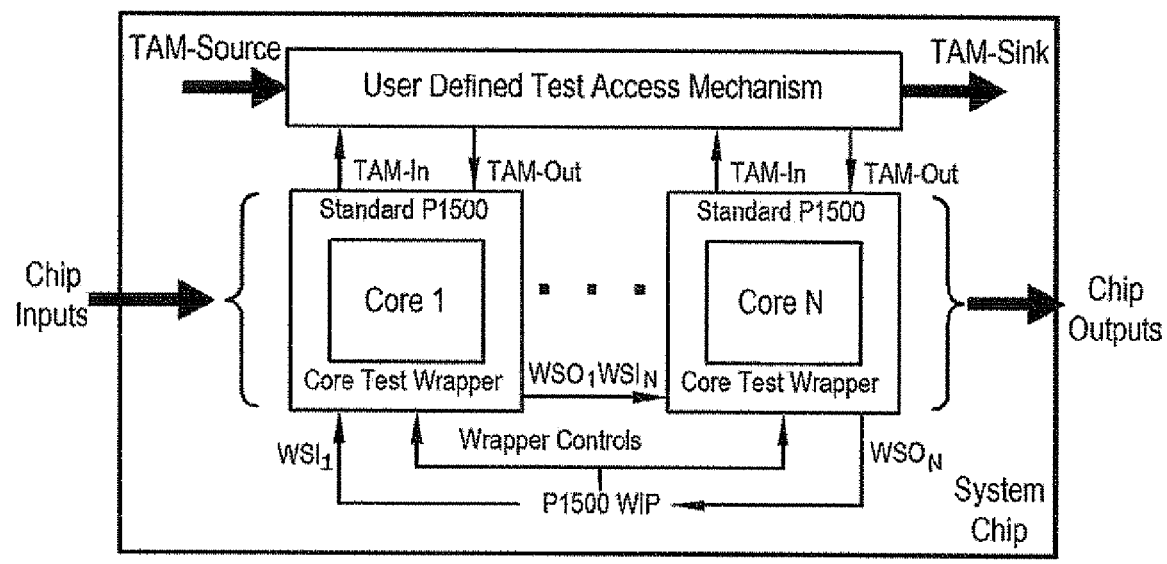

SoC test mechanism standards, such as core P 1500 wrappers [2-5] and Core Test Language (CTL), are currently under development [1]. The IEEE P1500 standard improves testability features for both system chip interconnect and logic (IP cores), it allows isolating the cores from the embedded environment. FIG. 3 gives an overview of the P1500 scalable architecture. For test needs, each IP core must be encapsulated in a P1500 wrapper. The role of the wrapper is to allow the control of external inputs and to observe external outputs of the IP core by means of a peripheral scan-path. In addition, the wrapper allows the control of the IP core's internal scan-path. It also makes possible to define the operating mode of the IP core such as the functional mode, peripheral shift mode, internal shift mode, etc. So that tests information are disseminated within the SoC through a test bus or Test Access Mechanism (TAM).

FIG. 3 gives an overview of the P1500 scalable architecture. For test needs, each IP core must be encapsulated in a P1500 wrapper. The role of the wrapper is to allow the control of external inputs and to observe external outputs of the IP core by means of a peripheral scan-path. It also makes possible to define the operating mode of the IP core such as the functional mode, peripheral shift mode, internal shift mode, etc. So that tests information are disseminated within the SoC through a test bus or a Test Access Mechanism (TAM).

Figure 4:
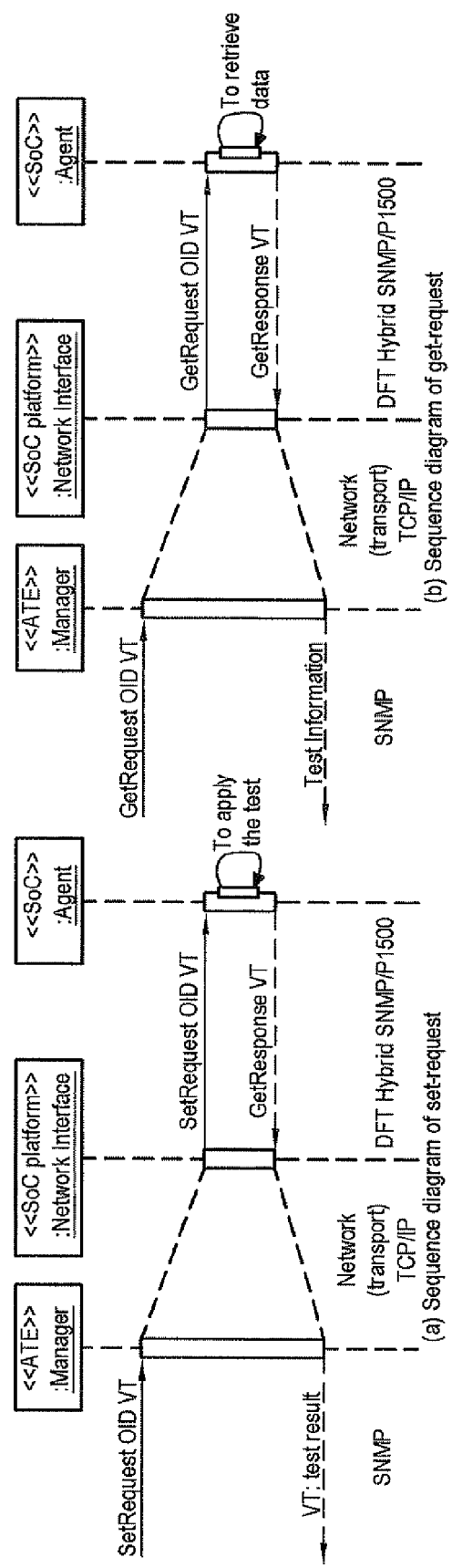
Figure 5:
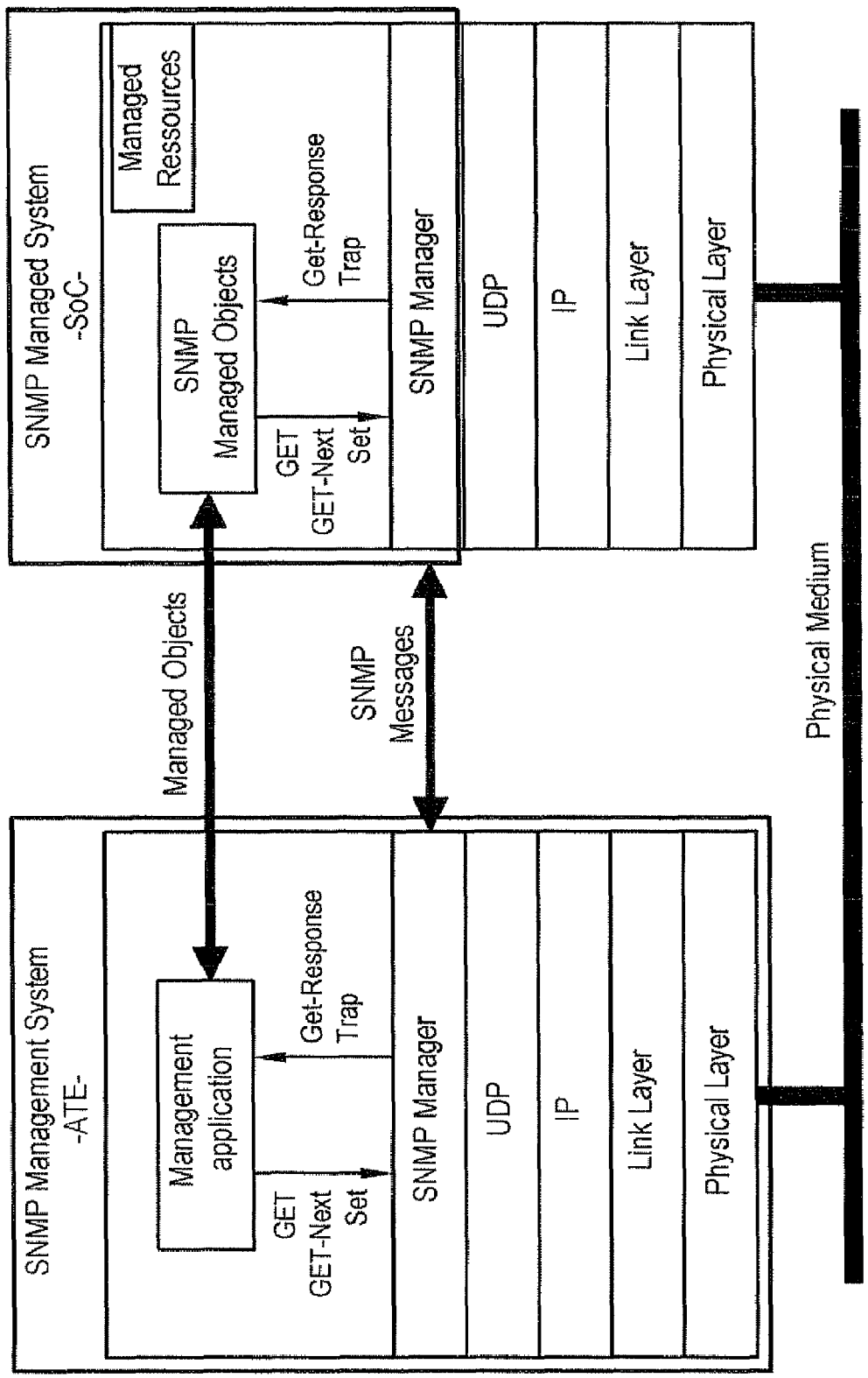
Figure 6:
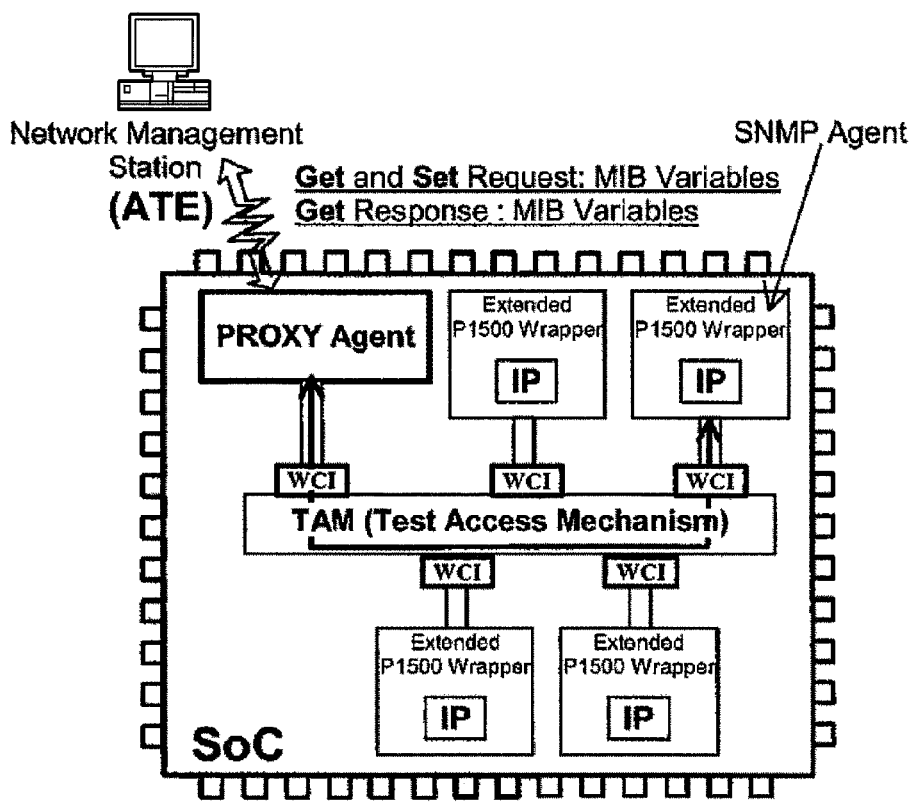
Figure 7:
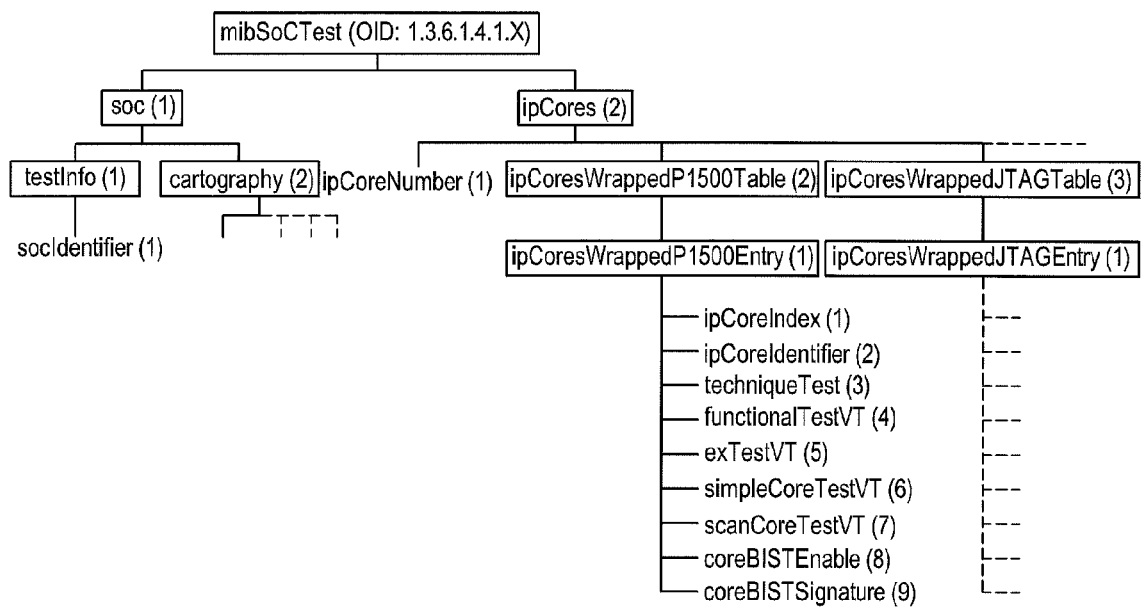
Figure 8:
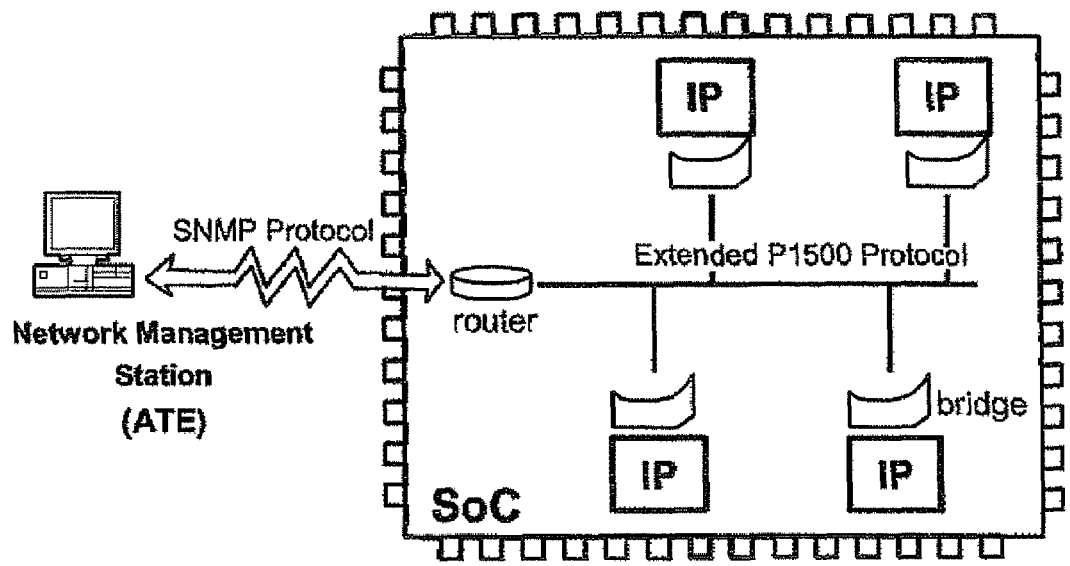
Figure 9:
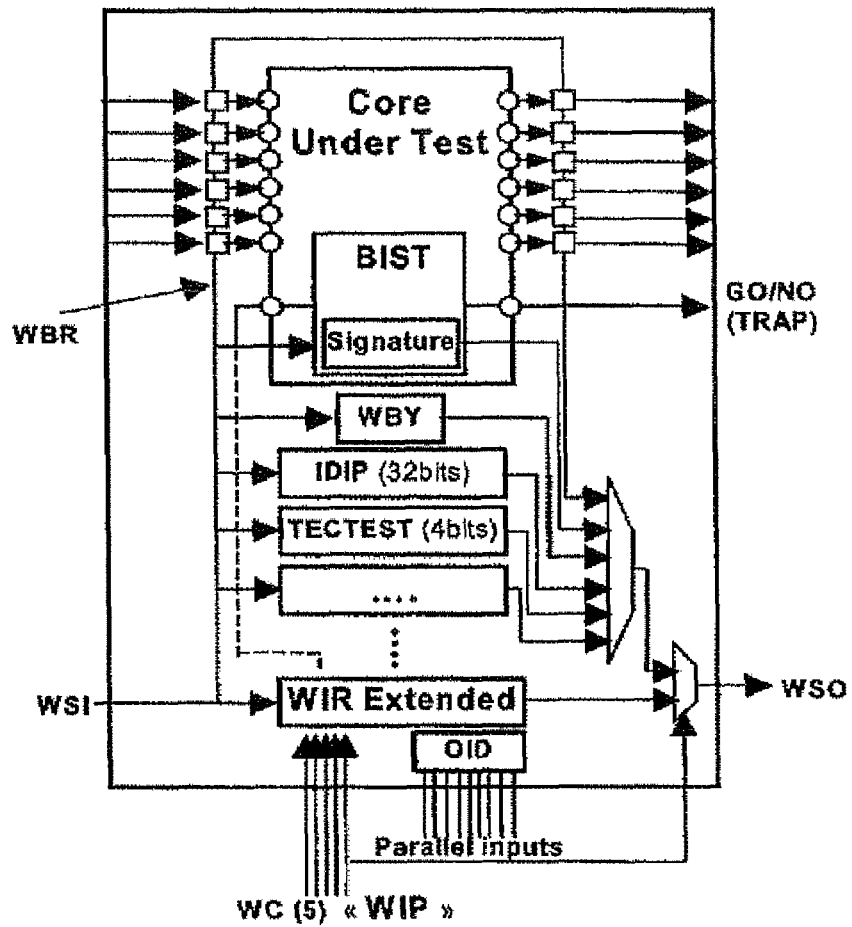
Figure 10:
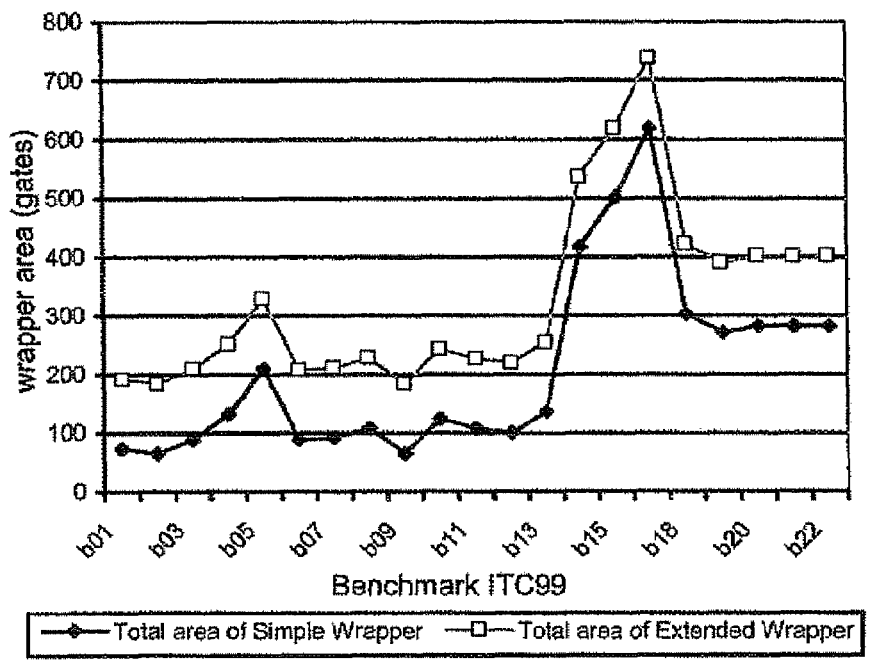
Figure 11:
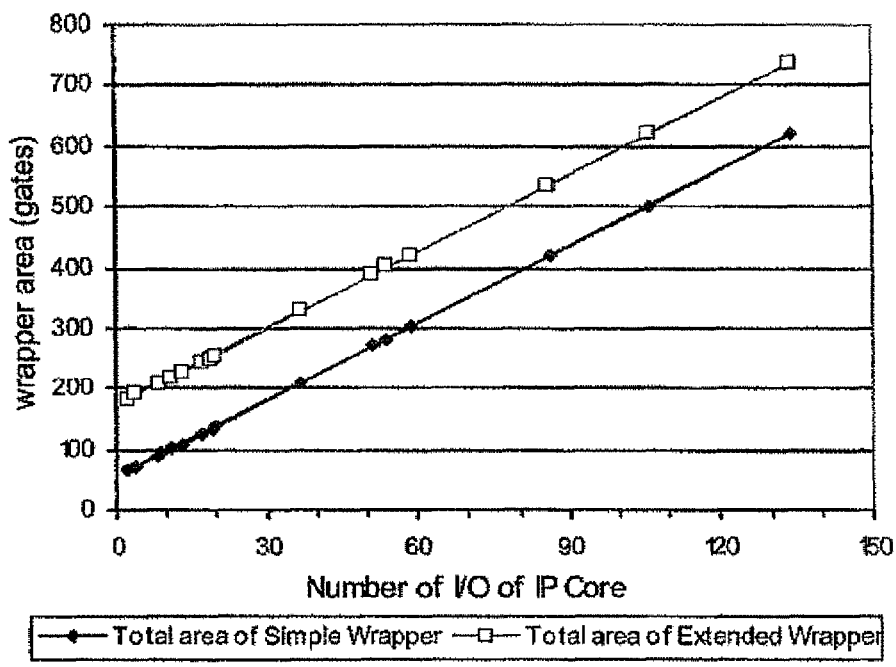
Figure 12:
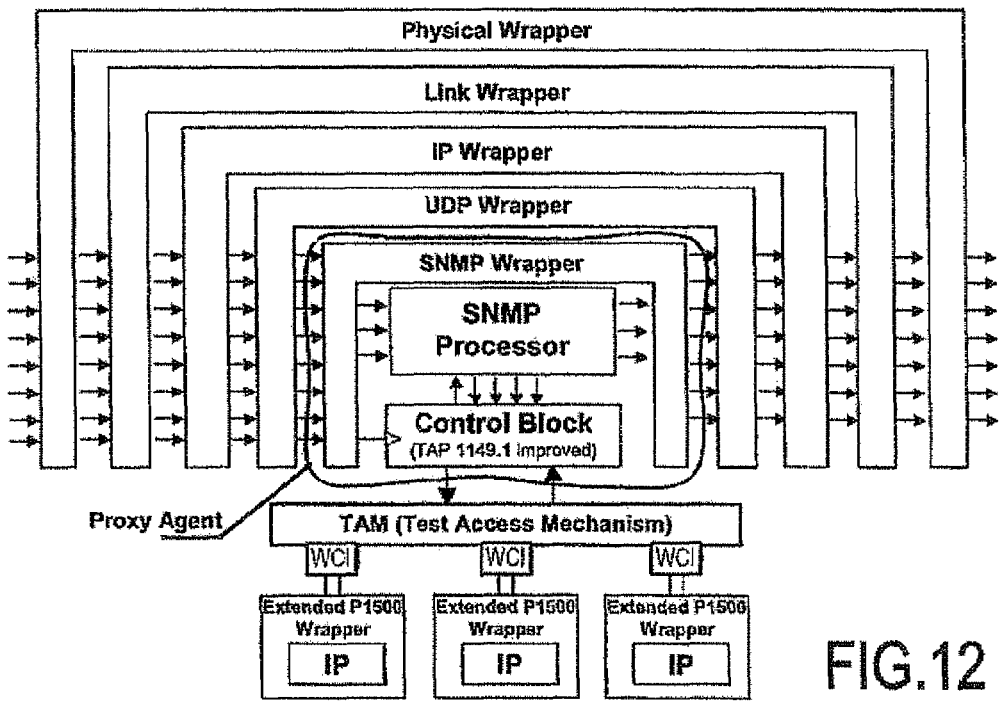
Figure 13:
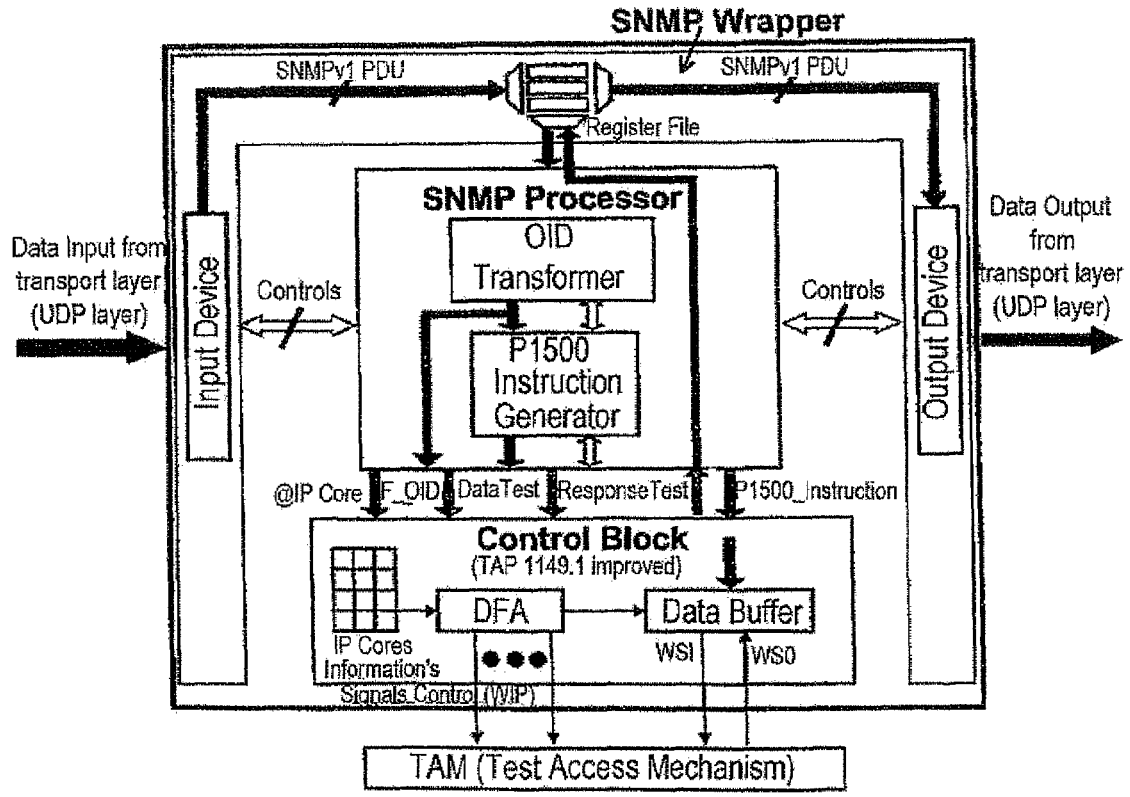
Figure 14:
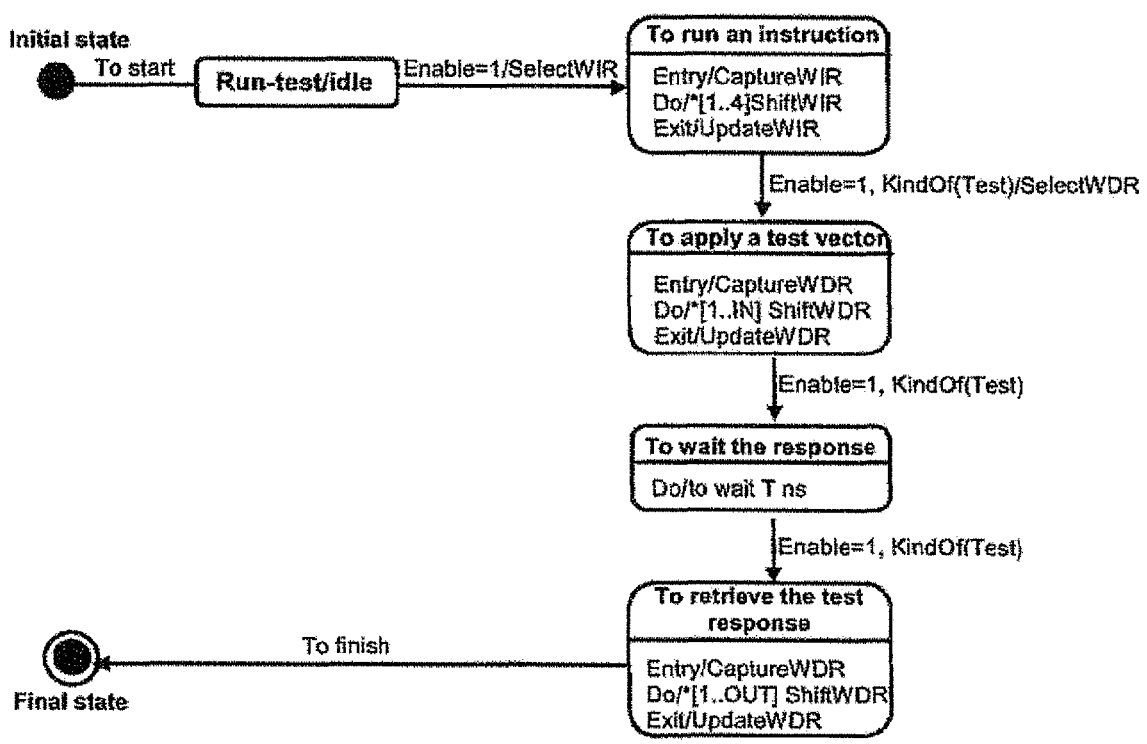

Further features, aspects and advantages of the invention will become better understood with regard to the following description, appended claims, and the accompanying drawings where:

The FIG. 1 shows a general SNMP environment;

The FIG. 2 shows the general principle of a SNMP based of System on chip SoC testing;

The FIG. 3 depicts an overview of the IEEE P1500 scalable architecture;

The FIG. 4 depicts a sequence diagram illustrating the information exchanges between the network management station (ATE) and the integrated circuit Chip (Soc) while processing a test remotely managed by the ATE;

The FIG. 5 depicts the basic SNMP messages between the network management station (ATE) and the integrated circuit Chip (Soc);

The FIG. 6 depicts a schematic view of a integrated circuit chip according to the invention;

The FIG. 7 depicts the structure of a Management Information Base MIB according to the invention;

The FIG. 8 depicts the operating modes of a proxy agent being part of the communication means of an integrated circuit chip according the invention;

The FIG. 9 depicts the architecture of the extended P 1500 wrapper located around each IP core of an integrated circuit chip according the invention;

The FIG. 10 depicts a synthesis results of both the simple and extended according to the invention P1500 wrapper adapted to benchmarks ITC99;

The FIG. 11 depicts the total area occupied by wrapper according to the input/output number of IP cores;

The FIG. 12 depicts an example of architecture for a hardware based proxy agent being part of the communication means of an integrated circuit chip according to the invention;

The FIG. 13 depicts more precisely the architecture the proxy agent being part of the communication means of an integrated circuit chip according to the invention;

The FIG. 14 is an overview of state-transition diagram of Deterministic Finite Automation within the proxy agent.

As invoked earlier, in it's preferred embodiment, the invention proposes a DFT technique which is a combination between the P1500 and SNMP standards. Indeed, outside the SoC, the approach is fully compliant with SNMP.

According to the invention, the P1500 architecture has been extended by adding the SNMP behavior. Given such an extension, the SoC becomes able to understand SNMP requests. SNMP is used to communicate management information between the network management stations (ATE) and the agents (SoC) within the network elements. SNMP requests (get-request, set-request . . . ) retrieve or modify the value of objects managed of SoC such as IP core identifier, SoC identifier, test vector, tests techniques, etc.

FIG. 4 shows the sequence diagrams. The later is represented in UML notation [25]. The set-request message (FIG. 4.a: set-request OID TV) applies tests vectors on the IP cores by specifying the identity (OID) and the test vector. In that case, the OID distinguishes the type of the applied test. In all of SNMP version, the contents of each variable-bindings of the array VarBindList are copied to the response. The error-status and error-index fields are set to zero to indicate success, or to appropriate values on error. It is similar in our approach but a get-response message replaces the place holder values of test vector with the test results. This choice is motivated by minimizing the SNMP requests number. That is to say, one set-request message is needed to apply test vectors and to retrieve test results instead tow messages: set-request to apply test vector and get-request to retrieve test results. However, the get-request message (FIG. 4.b: get-request OID) retrieves test information of either the IP core or the SoC by specifying for example the identity of an instance of test information. When no error occurs processing the, a get-response message replaces the place holder values with the actual values of test information. Therefore, with such facilities the SMNP protocol reaches the internal structure of an IP core.

As shown in the FIG. 5, SNMP protocol standardizes the relationship between a manager and an agent. A manager is responsible for supervising the designated functions of many agents. Communication among protocol entities is accomplished by the exchange of messages, each of which is entirely and independently represented within a single UDP datagram using the Basic Encoding Rules (BERs) of ASN. 1 [22, 26]. A message consists of a version identifier, an SNMP community name, and a Protocol Data Unit (PDU). Therefore, the SNMP architecture is divided to two parts: the client side which represents the ATE in our case, and the server side representing the SoC. On the SoC side, only SNMP application layer is considered since the layered protocol wrappers (UDP and IP wrappers) [13] are used.

In the preferred embodiment of the invention, SNMPv1 protocol (message format) is considered because it fully satisfies all the requirement of a testing/management solution. Also, SNMPv1 is simple and does not require lot of resources for both silicon area overhead and time of functioning on chip. But according to the invention, others protocols can be used.

At the architecture level, a SoC is considered as an embedded distributed system within an electronic device/system. According to the invention the integrated circuit chip or SoC comprises a plurality of functional core or IP cores. Each of these IP cores are wrapped by using the extended P 1500 wrappers. The later represent the SNMP agents managed (FIG. 6) by Proxy Agent (PA) being part of the communication means of the SoC. Usually, IP cores are interconnected by the means of a bus or a complex communication network. The invention allows the management of the proposed infrastructure starting from a network management station through the PA component (FIG. 6). The PA whose architecture is detailed below is a hardware-based SNMP agent (FIG. 6). It is totality implemented in hardware. This component monitors and controls of the embedded cores under test.

The PA is used to translate information between SNMP and P1500 protocols. That is, a PA provides a protocol conversion function which allows a management station to apply a consistent management framework of ail SoC and IP cores infrastructures. Consequently, a PA can be considered as an IP core, which gets SNMP requests coming from the management station (or ATE). Such requests are converted towards instructions in conformity with the extended P 1500 standard.

In a similar way, the answers of the IP core are converted towards a SNMP protocol representation (get-response or Trap). Finally, test results are sent to the ATE as SNMP requests. The MIB (Management information Base) of a PA contains all test information that are related to a SoC. Each IP core embeds a MIB which represents the behaviour of the SNMP agent.

The FIG. 7 gives the structure of a Management Information Base MIB according to the invention. For an IP core or a SoC, the MIB describes the functionalities of test techniques associated to the P1500 wrapper as well as information relating to the testing process (e.g. test vectors, test results).

The MIB is divided in two parts: the information at the SoC level and those at the level of IP cores. The first part of the MIB is dedicated to the SoC: SoC identifier, configuration of basic components, etc.

The second part of the MIB is dedicated to the IP core. For instance, the table called "ipCoresWrappedP1500Table" is related to the information regarding P 1500 test architecture. The index of this table is called "ipCoreIndex". It represents the logical address of IP cores in the SoC environment. Other test techniques such as IEEE 1149.1 can be specified within the MIB if the IP cores are wrapped using a IEEE 1149.1 wrapper. The following table I gives main MIB variables which are handled by the proposed test architecture.

"SetRequest X.2.2.1.4.5 '1100110'b" is sent. However, this request is converted within the SoC into P1500 instruction called WS_SETREQUEST with flattened OID that equals "15". Also, the last number (IPCoreIndex) of the hierarchical OID represents the logical address (number "5") of the considered IP core.

In order to ensure the design reuse of the proposed architecture, the proxy agent operates in two modes: a bridge and a router mode (see FIG. 8). At the SoC level, the proxy agent

TABLE I

Definition of main managed objects

| Name | OID | Data Type | R/W | Description |
|------|-----|-----------|-----|-------------|
| SocIdentifier | X.1.1.1.0 | UInteger32 | R | SoC Identifier (SoC level) |
| ipCoreNumber | X.2.1.0 | Gauge32 | R | IP Core number |
| IPCoresWrappedP1500Table SEQUENCE OF ipCoresWrappedP1500Entry, Index = <IPCoreIndex> | | | | |
| ipCoreIdentifier | X.2.2.1.2.IPCoreIndex | UInteger32 | R | IP core Identifier (IP core level) |
| techniqueTest | X.2.2.1.3.IPCoreIndex | INTEGER (1..16) | R | Specify test technique: BIST, functional test, internal test or a combination of several techniques |
| functionalTestVT | X.2.2.1.4.IPCoreIndex | OCTET STRING | W | Functional test |
| ExTestVT | X.2.2.1.5.IPCoreIndex | OCTET STRING | W | External test |
| simpleCoreTestVT | X.2.2.1.6.IPCoreIndex | OCTET STRING | W | Internal test without concatenation of WBR register with internal scan registers |
| scanCoreTestVT | X.2.2.1.7.IPCoreIndex | OCTET STRING | W | Internal test by concatenation of WBR register with internal scan registers |
| coreBISTEnable | X.2.2.1.8.IPCoreIndex | OCTET STRING | W | Self-test (BIST) |
| coreBISTSignature | X.2.2.1.9.IPCoreIndex | OCTET STRING | R | BIST signature |

The relationship between the requests of SNMP and those of P1500 is implemented at the level of the proxy agent. This is shown in table II.

operates in a router mode since it operates between two different networks: a TCP/IP network outside the SoC and a dedicated Network-on-Chips (NoC) inside the SoC. At the

TABLE II

SNMP/P1500 relationship

| SNMP request | P1500 Instruction |
|--------------|-------------------|
| GetRequest X.1.1.1.0 | WS_GETREQUEST with OID <=1 ⇔ Recover the contents of IDSOC (32 bits) register which is at proxy agent level |
| GetRequest X.2.2.1.2.IPCoreIndex | WS_GETREQUEST with OID <=6 ⇔ Recover the contents of IDIP register (32 bits) which stores the IP core identifier |
| GetRequest X.2.2.1.3.IPCoreIndex | WS_GETREQUEST with OID <=7 ⇔ Recover the contents of TECTEST register (4 bits) which identifies the used test technique (i.e. scan, BIST . . . ). |
| SetRequest X.2.2.1.4.IPCoreIndex TV (test vector) | WS_SETREQUEST with OID <=15 ⇔ Start the functional test |
| SetRequest X.2.2.1.5.IPCoreIndex TV | WS_SETREQUEST with OID <=20 ⇔ Start the external test |
| SetRequest X.2.2.1.6.IPCoreIndex TV | WS_SETREQUEST with OID <=25 ⇔ Start the internal test |
| SetRequest X.2.2.1.8.IPCoreIndex TV | WS_SETREQUEST with OID <=35 ⇔ Start the self-test |
| . . . | |

At SoC level, the proxy agent converts SNMP requests into P1500 instructions. For example, the SNMP request "GetRequest X.1.1.1.0" is converted into WS_GETREQUEST P1500 instruction with flattened OID that equals "1". This flattened OID relates to the hierarchical OID "X.1.1.1.0". Inside a SoC, the flattened OID is considered instead of a hierarchical OID. This choice is motivated by the need of minimizing the processing logic of hierarchical OID for each IP cores. To better explain how the test architecture works, given a SoC under test, let's consider that a functional testing is needed for the fifth IP core. For that, the following test vector "1100110" is considered. Using SNMP, the request level of the IP core, the agent operates in a bridge mode since it operates in the same network.

The FIG. 9 shows the architecture of the extended P 1500 wrapper located around each IP core. This extension implements a large part of the MIB shown in FIG. 7, in particular, a part of the MIB dedicated to each IP core. The architecture of the extended P1500 wrapper contains the following blocks:

IDIP: a 32 bits register which stores the IP core identifier (i.e. manufacturer identifier, version, etc.).

TECTEST: a 4 bits register which identifies the used test technique (i.e. scan, BIST . . . ).

WBY, WBR, WSI, WSO, BIST, WIP: basic blocks which are already defined by the P1500 standard [5]. Please refer to [2-5] for more information.

WIR (Wrapper Instruction Register) Extended: this logic extends the classical P1500 instruction register in order to support SNMP instructions. Indeed, new instructions are necessary for the extended architecture. The following table summarizes these new instructions:

TABLE III

List of the added instructions

| Instruction | Description |
| --- | --- |
| WS_SETREQUEST | Carries out the test |
| WS_GETREQUEST | Finds test information from the agent (IP core) |
| WS_GETNEXTREQUEST | Finds next test information |

OID (Object IDentifier) register: this register gets a flattened object identifier from a proxy agent. It completes the semantic of the added P1500 instructions. In fact, the OID information joins the added P1500 instruction at the IP core level (extended P1500 wrapper). This allows launching the appropriate operating mode.

Several experimentations have been conducted using twenty-two design benchmarks known as ITC99 benchmarks (b01 to b22) [27]. The considered design flow is based on Synopsys® tools. The obtained results are summarized in FIGS. 10, 11 and in Table IV as well.

FIG. 10 shows the synthesis results of both the simple and the extended P1500 wrapper adapted to benchmarks ITC99. The FIG. 10 compares between the area needed by the simple wrapper and the silicon area which is required by the extended wrapper. The obtained results are detailed in table IV. Please, notice that the area and timing values are given in "gate" account and in "ns" respectively.

As shows in the FIGS. 10 and 11, the area is lightly affected by the proposed architecture. This is also illustrated in table IV.

specifies the percentage of the area occupied by the extended wrapper compared to the total area of the IP cores (ITC99 benchmarks). The sixth and seventh rows give information about delays in dock cycles of data passing through the extended wrapper. The last row specifies maximum frequency of each synthesized wrapper. In summary, for the considered IP core, an SNMP interface necessitates a few added logic because the difference between area overhead occupied by simple wrapper and extended wrapper is only 119 gates. The presented results have considered a 0.18μ CMOS technology library. This library was used for several examples of industrial integrated circuits.

The proposed architecture is cost-effective. Furthermore, It has several advantages: (1) it is 100% compliant with classical P1500 wrappers; (2) it ensures the scalability of the MIB when new objects and new OIDs will be added; (3) the internal protocol is not affected.

The FIG. 12 illustrates the hardware-based networking architecture of the proxy agent. The protocol wrappers proposed in [13] are shown in the FIG. 12. These wrappers are layered according to the following protocols: Physical, Data Link, IP and UDP. However, using the proposed architecture, a new network application interface is adapted to the UDP wrapper interface.

The proxy agent communicates with IP cores through the TAM. Indeed, the proposed proxy agent is composed of three components: the SNMP wrapper, the SNMP processor and the control block.

The SNMP wrapper (FIG. 13) is composed of two components: InputDevice and OutputDevice. The InputDevice receives request messages [10] from the UDP wrapper. The InputDevice first collects the request message in the Registers File (RF, it supports one SNMP Message). As soon as it is collected, the incoming transport message is de-serialized (decoded) by using the BERs [26] of ASN. 1 [22]. Next, the InputDevice constructs an ASN. 1 object. It then verifies the version number of the SNMP message. In case of a mismatch, it discards the message and it performs no further actions. The community name found in the SNMPv1 message is saved (it is input to a future security mechanism). The InputDevice then performs a simple parse on the ASN. 1 object constructed. Finally, it builds an ASN. 1 object corresponding to an SNMPv1 PDU object (the value of request-id is saved).

TABLE IV

Implementation results of the extended P1500 wrapper

| | b01 | b02 | b04 | b05 | b07 | b11 | b12 | b14 | b15 | b17 | b18 | b19 | b20 | b22 |
| --- | --- | --- | --- | --- | --- | --- | --- | --- | --- | --- | --- | --- | --- | --- |
| Input | 2 | 1 | 11 | 1 | 1 | 7 | 5 | 32 | 36 | 37 | 36 | 21 | 32 | 32 |
| Output | 2 | 1 | 8 | 36 | 8 | 6 | 6 | 54 | 70 | 97 | 23 | 30 | 22 | 22 |
| In + out | 4 | 2 | 19 | 37 | 9 | 13 | 11 | 86 | 106 | 134 | 59 | 51 | 54 | 54 |
| Simple wrapper (Gates) | 116 | 102 | 221 | 349 | 151 | 179 | 165 | 696 | 838 | 135 | 506 | 450 | 471 | 471 |
| Extended wrapper (Gates) | 320 | 306 | 425 | 553 | 355 | 383 | 369 | 900 | 1042 | 1239 | 710 | 654 | 675 | 675 |
| Area occupied (%) | >100 | >100 | 58 | 55 | 80 | 50 | 34 | 9 | 12 | 4 | 0.6 | 0.2 | 3.3 | 2.2 |
| Data required time(ns) | 9.8 | 9.8 | 9.8 | 9.8 | 9.8 | 9.8 | 9.8 | 9.8 | 9.8 | 9.8 | 9.8 | 9.8 | 9.8 | 9.8 |
| Data arrival time(ns) | 6.51 | 6.51 | 6.52 | 6.52 | 6.51 | 6.52 | 6.51 | 6.56 | 6.56 | 6.56 | 6.56 | 6.52 | 6.52 | 6.52 |
| Speed (MHz) | 300 | 300 | 300 | 300 | 300 | 300 | 300 | 300 | 300 | 300 | 300 | 300 | 300 | 300 |

The three first rows represent the number of input and output pins for each ITC99 benchmarks. The fourth row gives the area overhead of the extended wrapper. The fifth row The SNMP processor analyses the SNMPv1 PDU received from InputDevice. The SNMP processor is composed of two components: OID transformer and P1500 Instruction Generator. The SNMP processor translates information between SNMP and P1500 protocols. Indeed, using a OID transformer, the SNMP processor first transforms the hierarchical OID towards a flattened OID. Furthermore, it recovers the logical address of IP core to be tested. Next, using P1500 Instruction Generator, the SNMP Processor generates P1500 instructions and as soon as the conversion terminates, SNMP Processor activates the control block in order to supervise the test of embedded core under test.

The Control Block receives the following outputs from the SNMP Processor: logical address of IP core, flattened OID, data test and P1500 Instruction. Using a Deterministic Finite Automation (DFA), the control block generates the P1500 controls signals known as WIP signals (Wrapper Interface Port) and a data signal known as WSI signal (Wrapper Serial Input). When the test process terminates, the DFA accumulates in the Data Buffer (DB) the test response coming from the embedded core via WSO signal (Wrapper Serial Output).

The FIG. 14 shows the simple form of the DFA state-transition diagram using UML notation. This diagram consists of round rectangles which represent states and directed line segments to represent transitions between the states. One or more actions may be associated with each transition. In the first stage, starting from the initial state, the control block carries out a P1500 instruction. However, the DFA first captures data in register WIR (Wrapper Instruction Register), in fact, the parallel capture of data is optional, it is used only with a parallel TAM. DFA then shifts the P1500 Instruction in WIR. Finally, this finite state machine updates (running) the instruction shifted in the WIR. In the second stage, the control block applies a test vector. The DFA shifts the test vector in the data register WDR (Wrapper Data Register) selected by the WIR circuitry. It then updates the test vector within the IP core. Finally, in the last stage, after waiting the response at the level of the IP core output pins, the Control Block retrieves the test response by shifting the response in DB.

The OutputDevice receives the data responses from the SNMP processor. The OutputDevice first constructs a get-response PDU using as input the saved request-id value and the values for Error-Status, Error-Index and VarBindList returned from processing the request. The PDU and the community string are used to generate an SNMPv1 message. The message is then senialized (encoded), using the BERs of ASN.1. OutputDevice then sends the SNMPv1 message using a transport service to the manager address from the request.

The InputDevice and OutputDevice are based on BERs for decoding and encoding the input and output messages, respectively. BERs specify a series of procedures for transfer syntax of types specified with ASN. 1. A transfer syntax is the actual representation of octets to be sent from one network entity to another.

The Table V summarizes the implementation results of the proxy agent.

TABLE V

Implementation results of the proxy agent.

| Components | Area (gates) | | Total Area (gates) | |
|---|---|---|---|---|
| InputDevice | 1065 | 1067 | 15323 | 16369 |
| Registers File | 8931 | 11281 | | |
| OutputDevice | 3476 | 3480 | | |
| SNMP Processor | 304 | 304 | | |
| Control Block | 1069 | 1084 | | |
| Speed (MHz) | 100 | 200 | 100 | 200 |

The three first rows give the area overhead of the SNMP wrapper including the three blocks: InputDevice, OutputDevice and Registers File. The Registers File represents the memory which stores fields of the SNMP message de-serialized by InputDevice. The next two rows are related to the area overhead of bath the SNMP Processor and control block, respectively. The maximum frequency of proxy agent is given in the next row. Indeed, today SoCs are very complex and embeds tens of millions of gates; the agent proxy necessitates an added logic equivalent to a simple IP cane such as b 17 of the used benchmark.

The following documents and publications are incorporated herein by reference and can be consulted for further details on the technologies and protocols implemented by the invention.

[1] E. J. Marinissen, Y. Zorian, R. Kapur, T. Taylor, and L. Whetsel. Towards a standard for embedded core test: An example, In IEEE International Test Conference (ITC), pp 616-627, New Jersey, USA, September 1999.

[2] Y. Zorian, Embedded Tutorial: System-Chip Test Strategies, 35e" annual ACM IEEE conference on Design Automation Conference, pp 752-757, California, USA, June 1998.

[3] E. J. Marinissen and Y. Zorian, Challenges in Testing Core-Based System ICs, IEEE Communication Magazine, Vol. 37, No. 6, pp. 104-109, June 1999.

[4] E. J. Marinissen, R. Kapur and Y. Zorian, On Using IEEE P 1500 SECT for Test Plug-n-Play. IEEE International Test Conference (ITC), pp 770-777, New Jersey, USA, October 2000.

[5] IEEE P1500 Web Site. http://grouper.ieee.orglgroups/1500/, March 2004.

[6] The Internet Engineering Task Force (IETF). RFC document database. http://www.ietf.org/, January 2004.

[7] D. Perkins and E. McGinnis, *Understanding SNMP MJBs*, Prentice Hall, mc, New Jersey, 1997.

[8] D. R. Mauro and K. J. Schmidt, *Essential SNMP*, O'Reilly, California, 2001.

[9] J. Case, M. Fedor, M. Schoffstall and J. Davin, A Simple Network Management Protocol (SNMP), RFC 1157, SNMP Research, Performance Systems International, and MIT LCS, May 1990.

[10] M. Goto and K. D. Hilleges, The DFT-Age ATE Architecture—The Multi-Port ATE, in SEMICON SEMI Technology Symposium (STS), pp. 82-91, Chiba, Japan, December 2000.

[11] D. Harrington, R. Presuhn and B. Wijnen, An Architecture for Describing Simple Network Management Protocol (SNMP) Management Frameworks, RFC 3411, STD 62, December 2002.

[12] M. L. Bushnell and V. D. Agrawal, Essentials of Electronic Testing for Digital, Memory, and Mixed-Signal VLSI Circuits, Kluwer Academic, pp 690, 2000.

[13] F. Braun, J. W. Lockwood and M. Waldvogel, Layered Protocol Wrappers for Internet Packet Processing in Reconfigurable Hardware, Proc. of Hot Interconnects 9 (HotI-9), pp. 93-98, California, USA, August 2001.

[14] J. W. Lockwood, C. E. Neely, C. K. Zuver, J. Moscola, S. Dharmapurikar and D. Lim, An Extensible, System-On-Programmable-Chip, Content-Aware Internet Firewall, Field-Programmable Logic and Applications, FPL'03, pp 859-868, Lisbon, Portugal, October 2003.

[15] I. Moscola, J. W. Lockwood, R. P. Loui and M. Pachos, Implementation of a Content-Scanning Module for an Internet Firewall, 11th Annual IEEE Symposium on Field-Programmable Custom Computing Machines, FCCM'03, pp 31-38, California, USA, April 2003.

[16] John W. Lockwood, James Moscola, David Reddick, Matthew Kulig and Tim Brooks, Application of Hardware Accelerated Extensible Network Nodes for Internet Worm and Virus; Protection, Active Networks, IFIP TC6 5th International Workshop, IWAN'03, pp 44-57, Kyoto, Japan, December 2003.

[17] J. Postel, User Datagram Protocol, RFC 768, ISI, August 1980.

[18] J. Case, K. McCloghrie, M. Rose and S. Waldbusser, Coexistence between Version 1 and Version 2 of the Internet-standard Network Management Framework, RFC 1908, SNMPv2 Working Group, SNMP Research inc, Cisco Systems inc, Doyen Beach Consulting inc, INS, Standards Track, January 1996.

[19] D. Levi, P. Meyer and B. Stewart, SNMPv3 Applications, RFC 2273, SNMP Research inc, Secure Computing Corporation, Cisco Systems, Standards Track, January 1998.

[20] IEEE Standard Board. IEEE std 1149.1-1990, standard test access port and boundary scan architecture, New York, NY 1OO17-2394, 1990.

[22] International Organization for Standardization (ISO), Specification of Abstract Syntax Notation One (ASN.1), International Standard, ISO-8824, 1987.

[23] M. Rose and K. McCloghrie, Structure and Identification of Management Information for TCP/IP-based Internets, RFC 1155, Performance Systems International and Hughes LAN Systems, May 1990.

[24] J. Case, K. McCloghrie, M. Rose and S. Waldbusser, Protocol Operations for version 2 of the Simple Network Management Protocol (SNMPv2), RFC 1448, SNMP Research, Hughes LAN Systems, Doyen Beach Consulting, Carnegie Mellon University, April 1993.

[25] J. Rumbaugh, I. iacobson and G. Booch, The Unified Modelling Language Reference Manual, Addison-Wesley, 1999.

[26] Information processing systems—Open Systems Interconnection, Specification of Basic Encoding Rules for Abstract Notation One (ASN.1), International Organization for Standardization, international Standard, ISO-8825, December 1987.

[27] Politecnico di Tonna ITC'99 benchkmarks, downloadable at the URL. http://www.cad.polito.ititools/itc99.html, 1999.

[28] R. Frye, D. Levi, S. Routhier and B. Wijnen, Coexistence between Version 1, Version 2, and Version 3 of the Internet-standard Network Management Framework, RFC 3584, BCP 74, August 2003

The invention claimed is:

1. Integrated circuit chip comprising:
   at least two functional or IP cores;
   for each functional or IP core, testing means for testing the functional or IP core;
   communication means for connecting each functional or IP core to an external communication network;
   wherein the communication means comprise a test bus (TAM) connected to the testing means and a proxy agent (PA) connected to the test bus and to the external communication network.

2. Integrated circuit chip according to claim 1, wherein the testing means of each functional or IP core comprise a wrapper in which the functional or IP core is embedded.

3. Integrated circuit chip according to claim 2, wherein the wrapper of the testing means of each functional or IP core implements the IEEE P1500 standard architecture.

4. Integrated circuit chip according to claim 3 wherein the proxy agent (PA) comprises an SNMP processor which translates the information between SMNP and P1500 protocols.

5. Integrated circuit chip according to claim 1, wherein the communication means allow a remote control of the testing means via the communication network.

6. Integrated circuit chip according to claim 1, wherein the proxy agent (PA) implements an SMNP protocol.

7. Integrated circuit chip according to claim 6 wherein the proxy agent (PA) comprises an SNMP processor which translates the information between SMNP and P1500 protocols.

8. Integrated circuit chip according to claim 1 wherein the communication means comprise at least one TCP/IP network interface circuit.

9. System for testing at least one functional or IP core embedded in an integrated circuit ship comprising:
   an integrated circuit chip according to claim 1;
   a communication network connected to the communication means of the integrated circuit chip;
   a network management station (ATE) connected to the communication network and able to communicate with the testing means of the integrated circuit chip via the communication network and the communication means of the integrated circuit chip.

10. System for testing at least one functional or IP core embedded in an integrated circuit chip according to claim 9 wherein the communication network is a TCP/IP network.

11. System for testing at least one functional or IP core embedded in an integrated circuit chip according to claim 10, wherein the network management station (ATE) performs an automatic test of a functional or IP core of the integrated circuit chip.

12. System for testing at least one functional or IP core embedded in an integrated circuit chip according to claim 9, wherein the network management station (ATE) performs an automatic test of a functional or IP core of the integrated circuit chip.

* * * * *